United States Patent [19]

Watson et al.

[11] Patent Number: 4,661,881
[45] Date of Patent: Apr. 28, 1987

[54] OVERLOAD PROTECTOR FOR A TELEPHONE SET

[75] Inventors: John C. Watson; Bing G. Chan, both of London, Canada

[73] Assignee: Northern Telecom Limited, Montreal, Canada

[21] Appl. No.: 651,482

[22] Filed: Sep. 17, 1984

Related U.S. Application Data

[63] Continuation-in-part of Ser. No. 480,260, Mar. 30, 1983, Pat. No. 4,486,804.

[51] Int. Cl.⁴ ............................................. H02H 5/04
[52] U.S. Cl. .................................. 361/104; 361/119; 361/400; 337/239; 337/407
[58] Field of Search ............... 337/195, 219, 194, 404, 337/407, 239; 361/104, 400, 405

[56] References Cited

U.S. PATENT DOCUMENTS

| | | | |
|---|---|---|---|
| 2,734,150 | 2/1956 | Beck | 361/400 |
| 4,047,143 | 9/1977 | Burden | 337/239 |
| 4,379,318 | 4/1983 | Ootsuka | 361/104 |
| 4,441,093 | 4/1984 | Okazaki | 337/404 |
| 4,553,114 | 11/1985 | English | 361/400 |

Primary Examiner—A. D. Pellinen
Assistant Examiner—H. L. Williams
Attorney, Agent, or Firm—Sidney T. Jelly

[57] ABSTRACT

An overload protector for a telephone set or other telecommunications terminal comprises an electrical component having DC continuity and DC resistance mounted by leads on a circuit board, the leads soldered to the conductor pattern. On application of an overload, the component heats up to a level at which sufficient heat travels along the leads to melt the solder. Usually both leads become unsoldered. One or both leads part from the conductor pattern under the effect of gravity; under the effect of a compression spring on one or both leads and held in compression between component and circuit board; or a combination of both. A convenient component is a carbon block resistor, in the Tip or Ring line. A heat insulating member can be positioned around the component. The insulating member can be a sleeve loosely fitting over the resistor and retaining heat in the resistor, or a coating or layer directly on the component.

9 Claims, 3 Drawing Figures

OVERLOAD PROTECTOR FOR A TELEPHONE SET

This application is a continuation-in-part of application Ser. No. 480,260, filed Mar. 30, 1983, now U.S. Pat. No. 4,486,804, issued Dec. 4, 1984.

This invention relates to an overload protector for a telephone set, or other telecommunications terminal, and is particularly concerned with a slow acting fusing device for overcurrent protection.

Telephone sets and similar terminals, can be subject to both voltage and current overloads, as a result of lightning induced surges and AC power cross faults. While protection is provided at various positions in the telephone system, including at the entry position of a customer, it is desirable, and is becoming a requirement, that protection be provided in the terminal itself. Also, in some areas of use, direct connection of a terminal to a power source can occur because of the use of similar connective devices. In such instances, protection is essential in the terminal.

The terminal is required to remain operational following a number of surges of the order of 50 amperes, but, under the condition of a continually applied high voltage or fault current it is necessary that the terminal be isolated.

There are various slow acting fuse devices, but various problems or disadvantages occur. In some cases they represent extra components in the circuitry and can result in problems in the circuit. The devices can represent a cost which adversely affects the total cost of the terminal. Some devices, while going "open circuit" under overcurrent conditions, will permit arcing under high voltage conditions, and this can be dangerous.

The present invention makes use of a component having DC continuity and DC resistance, normally present as part of the telephone set circuitry. One such component is a carbon block or slug composition type resistor in series in one of the lines. Another such component is a choke.

The component is mounted on a printed circuit board (PCB) which is an existing part of the terminal. The component is mounted by means of leads on the side of the PCB remote from the conductor pattern to which the component is connected. The leads can be soldered to the conductor pattern by the solder used to attach other components and devices, or a particular fusible alloy may be used. In operation, a continuous overload above a predetermined value causes the component to heat sufficiently for the heat to travel down the leads and eventually melt the solder, or fusible alloy. In one arrangement, the component moves under the effect of gravity to cause one or both leads to move away from the conductor pattern. In another arrangement a compression spring is positioned on at least one lead, held between the PCB and the component. The spring or springs force one or both leads out of the PCB, giving an open circuit. When one lead is freed first, the heat content of the device is generally sufficient to cause the other lead to be freed also. While the freeing of one lead is sufficient to create an open circuit, if two leads are freed, with complete removal of the component, the air gap is increased and any electric arc which is generated will be extinguished. A heat insulating member may be positioned around the component to increase heating of the component.

The invention will be readily understood by the following description in conjunction with the accompanying drawings, in which.

Figure 1:
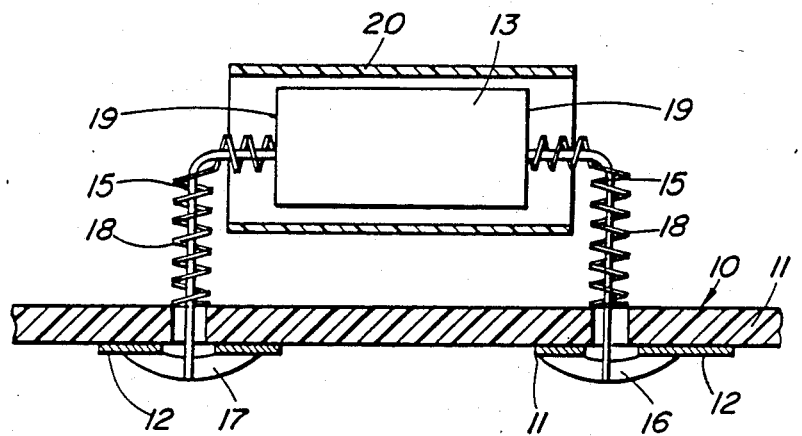
FIG. 1 is a diagrammatic cross-section through one arrangement in accordance with the invention.

As illustrated in FIG. 1, a printed circuit board 10 is composed of an insulating support member 11 and circuit patterns 12 on one surface. Mounted above the support member 11 is a component 13, in the present example, a resistor. The leads 15 of the resistor pass through the PCB, being soldered to the pattern 12 at 16 and 17 respectively. A compression spring 18 is positioned on each lead 15. The springs are compressed between the end surfaces 19 of the resistor and the surface of the PCB. Around the resistor 13 is a sleeve or tube 20 of heat insulating material, for example of woven glass fiber. Only one spring 18 need be provided, on one of the leads 15. In many instances pushing of one lead out by a spring will also result in the other lead being released also.

Figure 2:
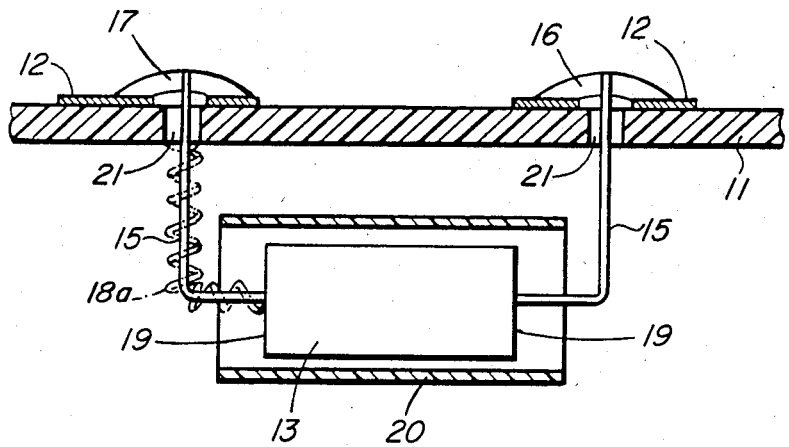
FIG. 2 is a diagrammatic cross-section through another arrangement in accordance with the invention.

Illustrated in FIG. 2 is an alternative arrangement in which the component 13, with insulating sleeve 20, is mounted below the support member 11, the leads passing up through holes 21 in the support member. The leads are soldered to the patterns 12 at 16 and 17. Again, in this arrangement, the component 13 is a resistor.

In a further alternative arrangement, with the component 13 mounted below the support member 11, as in FIG. 2, a compression spring is positioned on at least one of the leads 15, as indicated in dotted outline at 18a. The spring or springs, would be compressed between the ends 19 of the component and the surface of the PCB.

The resistor is in series with the terminal circuitry. The resistor is capable of withstanding lightning induced surges but heats up if a long term power load is applied, such as an AC power cross fault as occurs if a power line falls across a telephone line, or if the terminal is connected to a high voltage power supply, such as a business or domestic power supply.

The sleeve 20 can be omitted, depending upon the heating provided by the component. Some components provide, or result in more heating than others. The sleeve acts to contain the heat generated in the resistor, increasing the flow of heat to the leads. Continued application of the power fault results in sufficient heat reaching the solder at 16 and 17 and melt it. In FIG. 1, the springs 18 push the leads 15 out of the PCB. One lead may free first as for example if only one spring is used, but generally heat content is sufficient to free the other lead almost immediately. There will thus result an "open circuit" condition. In the arrangement of FIG. 2, at least one lead would fall out of the hole 21, with the other lead pivoting in the softened solder. Normally both leads would fall out. If one or more springs are also provided with the underneath mounting, as in FIG. 2, then they would assist in causing the leads to fall out of the holes 21.

Various adjustments can be made to give desired "failure" or "fuse" conditions. The solder can be varied, low melting point fusible alloys being used. The distance the resistor is mounted from the PCB can be varied. The degree of thermal insulation provided by the sleeve, if provided, can be varied. The thickness of the circuit patterns 12 and their area adjacent to the points of correction to the leads 15 can be varied to give a variable "heat sink" effect. More than one spring can be positioned on each lead.

A typical arrangement is as follows. The resistor is a carbon slug resistor, typically 1 watt 39 ohms, although this can vary, for example from about 10 ohms to about 40 ohms. 2 watt resistors have also been used. These stated values are standard values and approximate as some tolerances are allowed. The resistor in the example, is approximately ¾ inches long and ¼ inches in diameter. The sleeve 20 in the example, is a fairly loose sliding fit on the resistor and is of woven glass fiber. Other materials can be used but must be capable of withstanding the temperature effects. Thus there could be a coating or layer directly on the component. The sleeve could be a molded part, of heat resistant plastic for example, and could be rigid or flexible. There is about ¼ inches clearance between resistor and the surface 14 of the PCB, in the examples described, but the component can be mounted closer to the PCB.

Figure 3:
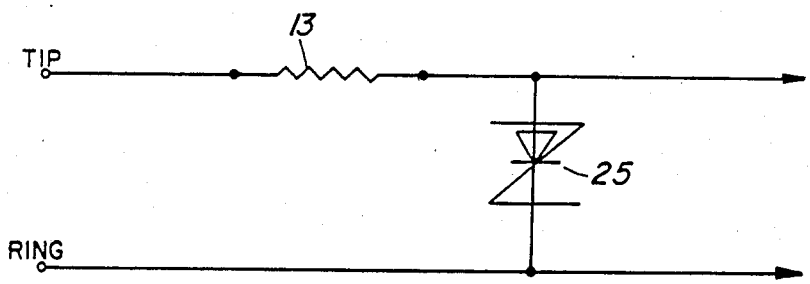
FIG. 3 is a diagrammatic illustration of the protection circuit.

FIG. 3 illustrates the application of the invention. In the circuit of FIG. 3 the resistor of FIGS. 1 and 2 is indicated at 13. A zener diode 25 is connected across Tip and Ring while the resistor is in series in one of the lines, in the example Tip.

Conveniently, the resistor 13 and the diode or other device 25 are mounted on the PCB forming part of the dial assembly, but can also be on any other convenient PCB. A resistor is usually provided in the circuit as part of a protection circuit. The present invention can make use of this resistor, avoiding an added series resistance as can occur with a conventional "slo-blow" fuse. This avoids interfering with the "Off Hook Terminal Resistance" that is the operating resistance presented to the line. This is often a critical and closely specified parameter and therefore a substantial advantage occurs using a normally provided resistor for the invention. By so doing, protection is provided to other circuitry in the terminal.

While the invention has been described using a resistor, other components having suitable characteristics can be used. The requirement is that the component have DC continuity and DC resistance, and of course be exposed to any overload which arrives at the telephone set. The component may have other characteristics, for instance, it may also have inductance. An example is a wire wound choke. An RF choke has DC resistance and inductance and also has DC continuity. It may be neceessary to wind the choke with wire of a gage which is larger than normal so as to be able to withstand lightning surges up to a predetermined value. Thus the choke would act as a lightning surge dissipator, an RF choke, and as a slow fuse. A typical resistance value for a choke is about 10 ohms.

Other components can also be used. Preferably, a component already part of the cirucit is used, but an additional component can be provided, specifically to act as a slow fuse but this detracts from the economy of the invention. The basic principle of the invention is to provide a component, preferably one already required in the terminal circuitry, and mount it on the circuit board such that it rapidly heats under the effect of a constant current or voltage overload and causes the solder joints between the component leads and the circuit to melt and release the component, the component being removed from the circuit board. This effectively prevents any reconnection or arcing.

What is claimed is:

1. An overload protector in the circuitry of a telephone set and similar telecommunications terminals, comprising:

an electrical component having DC continuity and DC resistance, said component in series with remaining components of said circuitry; said component having two leads, each lead soldered to a conductor of a circuit pattern on a circuit board; said component suspended below said circuit board;

the arrangement such that on a continuous overload above a predetermined value, the component heats up to a level such that heat travels down the leads and melts the solder for at least one lead, said at least one lead moving physically downward away from said circuit board to give an open circuit condition.

2. A protector as claimed in claim 1, including a heat insulating member around said component.

3. A protector as claimed in claim 2, said insulating member being of woven glass fiber.

4. A protector as claimed in claim 2, said insulating member being a loose fit on the component.

5. A protector as claimed in claim 1, said component connected in series in either one of the Tip and Ring lines of the telephone circuit.

6. A protector as claimed in claim 1, said component being a resistor having a main portion in the form of a carbon block, said leads extending laterally from each end of the main portion.

7. A protector as claimed in claim 6, said resistor being a 1 watt 39 ohms resistor.

8. A protector as claimed in claim 7, said resistor being about ¾ inches long and ¼ inches in diameter, there being about ¼ inches clearance between the main portion of the resistor and the circuit board.

9. A protector as claimed in claim 1, said circuit pattern being on an upper surface of said circuit board, said leads passing through holes in said circuit board to connect to said conductors.

* * * * *